(12) United States Patent
Mishima et al.

(10) Patent No.: US 9,776,209 B2
(45) Date of Patent: Oct. 3, 2017

(54) TRANSPARENT ELECTRICALLY CONDUCTIVE SUBSTRATE AND MANUFACTURING METHOD THEREOF

(75) Inventors: Takashi Mishima, Marugame (JP); Keisuke Goto, Marugame (JP); Florian Pschenitzka, San Francisco, CA (US); Jonathan Westwater, Kawasaki (JP)

(73) Assignees: OKURA INDUSTRIAL CO., LTD., Marugame-shi, Kagawa (JP); CAM HOLDING CORPORATION, Road Town (VG)

( * ) Notice: Subject to any disclaimer, the term of this patent is extended or adjusted under 35 U.S.C. 154(b) by 574 days.

(21) Appl. No.: 14/378,716

(22) PCT Filed: Feb. 16, 2012

(86) PCT No.: PCT/JP2012/053654
§ 371 (c)(1),
(2), (4) Date: Aug. 14, 2014

(87) PCT Pub. No.: WO2013/121556
PCT Pub. Date: Aug. 22, 2013

(65) Prior Publication Data
US 2015/0321220 A1 Nov. 12, 2015

(51) Int. Cl.
*B05D 3/04* (2006.01)
*B05D 1/26* (2006.01)
(Continued)

(52) U.S. Cl.
CPC .............. *B05D 3/042* (2013.01); *B05D 1/265* (2013.01); *B22F 7/04* (2013.01); *C09D 5/02* (2013.01);
(Continued)

(58) Field of Classification Search
None
See application file for complete search history.

(56) References Cited

U.S. PATENT DOCUMENTS

2004/0028936 A1 2/2004 Kogiso et al.
2007/0074316 A1 3/2007 Alden et al.
(Continued)

FOREIGN PATENT DOCUMENTS

| CN | 102319661 A | 1/2012 |
| JP | 2002-266007 A | 9/2002 |

(Continued)

OTHER PUBLICATIONS

De et al., "Silver Nanowire Networks as Flexible, Transparent, Conducting Films: Extremely High DC to Optical Conductivity Ratios", ACS Nano, vol. 3, No. 7, (2009), pp. 1767-1774.*
(Continued)

*Primary Examiner* — Lisha Jiang
(74) *Attorney, Agent, or Firm* — Westerman, Hattori, Daniels & Adrian, LLP (57) ABSTRACT

Method of manufacturing a transparent electrically conductive substrate having an application process whereby a wet layer is formed by applying onto a substrate film a coating liquid comprising metallic nanowires dispersed in a solvent, and a drying process whereby the solvent contained in the abovementioned wet layer is removed by drying, characterised in that the abovementioned drying process includes a process whereby the orientation of the abovementioned metallic nanowires is altered by introducing a forced draft facing towards the substrate from a direction that is different from the longitudinal direction of the substrate film.

10 Claims, 3 Drawing Sheets

Introduce forced draft from TD facing towards wet coat surface immediately after application (before drying) to disturb orientiation of wires (51) Int. Cl.
H01L 31/0224 (2006.01)
C09D 5/02 (2006.01)
B22F 7/04 (2006.01)
H01B 1/02 (2006.01)
F26B 21/00 (2006.01)
B82Y 30/00 (2011.01)
H01L 51/44 (2006.01)
B22F 1/00 (2006.01)
B05D 3/02 (2006.01)
B05D 7/04 (2006.01)
B22F 3/22 (2006.01)

(52) U.S. Cl.
CPC ............ F26B 21/004 (2013.01); H01B 1/02 (2013.01); H01L 31/022466 (2013.01); B05D 1/26 (2013.01); B05D 3/0272 (2013.01); B05D 3/0413 (2013.01); B05D 7/04 (2013.01); B05D 2252/02 (2013.01); B05D 2601/28 (2013.01); B22F 1/0025 (2013.01); B22F 3/22 (2013.01); B82Y 30/00 (2013.01); F26B 2210/00 (2013.01); H01L 51/442 (2013.01); Y10T 428/249924 (2015.04)

(56) References Cited

U.S. PATENT DOCUMENTS

| | | | |
|---|---|---|---|
| 2009/0052029 A1* | 2/2009 | Dai | B82Y 20/00 359/485.02 |
| 2010/0098902 A1 | 4/2010 | Kotov et al. | |
| 2011/0094651 A1 | 4/2011 | Kuriki | |

FOREIGN PATENT DOCUMENTS

| | | |
|---|---|---|
| JP | 2004-149871 A | 5/2004 |
| JP | 2006-233252 A | 9/2006 |
| JP | 2009-205924 A | 9/2009 |
| JP | 2011-086413 A | 4/2011 |
| JP | 2011-86413 A | 4/2011 |
| JP | 2011-90879 A | 5/2011 |
| JP | 2011-119142 A | 6/2011 |
| JP | 2011-198642 A | 10/2011 |
| JP | 2012-26065 | 2/2012 |
| JP | 2012-26065 A | 2/2012 |
| JP | 2012-36522 | 2/2012 |
| JP | 2012-36522 A | 2/2012 |
| TW | 200923971 A | 6/2009 |
| WO | 2007/022226 A2 | 2/2007 |
| WO | 2008/147431 A2 | 12/2008 |
| WO | 2009/035059 A1 | 3/2009 |

OTHER PUBLICATIONS

Sun et al., "Large-Scale Synthesis of Uniform Silver Nanowires Through a Soft, Self-Seeding, Polyol Process", Advanced Materials, 2002, pp. 833-837, vol. 14, No. 11, cited in the Specification.
Sun et al., "Uniform Silver Nanowires Synthesis by Reducing AgNO3 with Ethylene Glycol in the Presence of Seeds and Poly (Vinyl Pyrrolidone)", Chem. Mater., 2002, pp. 4736-4745, vol. 14, cited in the Specification.
International Search Report dated Apr. 24, 2012, issued in corresponding application No. PCT/JP2012/053654.
Search Report dated Nov. 3, 2016, issued in counterpart Taiwanese Application No. 101143257, with English translation. (2 pages).
Search Report dated Nov. 20, 2015, issued in counterpart Chinese Application No. 201280003532.X, with English translation. (4 pages).
Supplementary European Search Report dated Aug. 14, 2015, issued in counterpart European Patent Application No. 12 86 8792 (3 pages).

* cited by examiner

[Title of Document] Figures

$$R_{TD} / R_{MD} \approx 1.5$$

[Figure 6]

Introduce forced draft from TD facing towards wet coat surface immediately after application (before drying) to disturb orientiation of wires

[Figure 7]

TRANSPARENT ELECTRICALLY CONDUCTIVE SUBSTRATE AND MANUFACTURING METHOD THEREOF

TECHNICAL FIELD

The present invention relates to a method of manufacturing a transparent electrically conductive substrate whose surface resistance exhibits almost no anisotropy, comprising a substrate film on which is provided a conductive stratum containing metallic nanowires in an unaligned state of orientation. In particular it relates to a method in which a coating fluid containing metallic nanowires is dried after having been applied onto the substrate, an orientation of the metallic nanowires is modified such that the metallic nanowires become oriented non-uniformly.

BACKGROUND ART

Transparent electrically conductive substrates are used in flat displays and touch panels, and electroluminescent devices and the like. Typical transparent electrically conductive materials are configured from a substrate film and a metal oxide such as tin-doped indium oxide (ITO), and typical manufacturing methods are vapour-phase film forming methods such as vacuum deposition methods, sputtering methods and ion plating methods. However, alternatives are actively being developed in consideration of the difficulty in maintaining a stable supply of ITO due to its containing a rare metal, and the slow production speeds of vapour-phase film forming methods, for example.

One alternative comprises metallic nanowires (wire-shaped metallic objects having a diameter of between several tens and several hundreds of nm, and a length of between one and one hundred and several tens of μm) (patent literature 1, 2). Metallic nanowires have a fibre diameter that is sufficiently small that transparency is not adversely affected, and a fibre length that is sufficiently long to build a conductive network on the substrate even if added in small amounts. A transparent electrically conductive substrate is manufactured by applying onto a substrate a coating liquid comprising metallic nanowires dispersed in an aqueous solvent, and drying it.

PRIOR ART LITERATURE

Patent Literature

[Patent literature 1] JP A 2011-90879
[Patent literature 2] JP A 2011-119142
[Patent literature 3] JP A 2006-233252
[Patent literature 4] JP A 2002-266007
[Patent literature 5] JP A 2004-149871

Non-Patent Literature

[Non-patent literature 1] Adv. Mater., 2002, 14, 833-837
[Non-patent literature 2] Chem. Mater., 2002, 14, 4736-4745

SUMMARY OF THE INVENTION

Problem to be Resolved by the Invention

Figure 5:
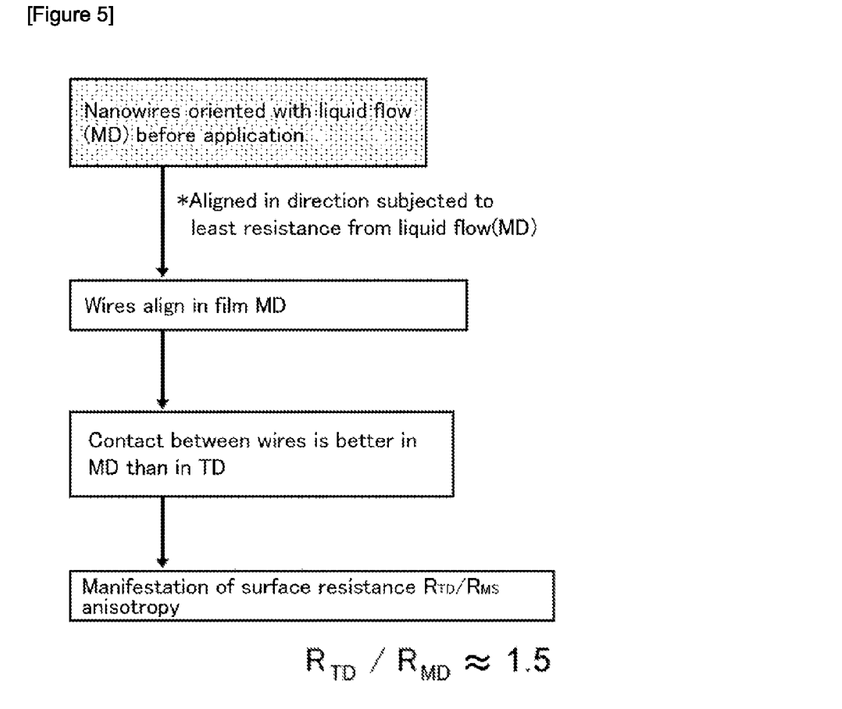
FIG. 5 is a flow diagram explaining why surface resistance anisotropy occurs.

However, an issue with transparent electrically conductive substrates in which metallic nanowires are employed is that the long axis of the metallic nanowires becomes aligned with the film transport direction (transport direction=longitudinal direction=MD [machine direction]). If the long axis of the metallic nanowires is aligned with the film MD then a difference (anisotropy) arises between the surface resistance in the MD and the surface resistance in the direction perpendicular to the MD (width direction=transverse direction=TD). That is to say, the TD resistance is larger than the MD resistance. This is because the MD conductive path is dense while the TD conductive path is sparse. It is not certain why the long axis of the metallic nanowires becomes aligned with the MD of the film, but possible reasons are as follows (refer to FIG. 5):

i) When the coating liquid is applied to the substrate film, the nanowires become oriented with the liquid flow (MD) due to the force that squeezes the liquid out (the nanowires align in the direction in which they are subjected to the least resistance from the liquid flow).

ii) After the coating liquid has been applied to the substrate film, the substrate film moves in the MD when the substrate film/coating liquid (wet layer) is being transported, thereby causing the nanowires contained in the wet layer to line up in the film MD.

In patent literature 1 a shear velocity ([film transport speed]/[gap between the distal end of the slot die head and the film]) is specified in order to overcome such problems. However, the film transport speed is limited by the capacity of the manufacturing equipment (in particular the drying equipment), and the gap between the distal end of the slot die head and the film is limited by the shape of the die and the properties of the coating liquid, and so unless the manufacturing equipment has sufficient drying capacity and has a slot die matching the properties of the liquid there will be limited scope for modifying the shear velocity, and it will not be possible to regulate the shear velocity such that the metallic nanowires become oriented non-uniformly.

Accordingly, the aim of the present invention is to provide a technique for improving the anisotropy of transparent electrically conductive substrates that employ metallic nanowires. That is, the aim is to provide a technique whereby the metallic nanowires become oriented non-uniformly by modifying the orientation of the metallic nanowires such that there is no difference between the TD surface resistance ($R_{TD}$) and the MD surface resistance ($R_{MD}$).

The aim of the present invention is to provide a method of manufacturing a transparent electrically conductive substrate whose surface resistance exhibits almost no anisotropy, comprising a substrate film on which is provided a conductive stratum containing metallic nanowires in a non-uniform state of orientation, and a transparent electrically conductive substrate whose surface resistance exhibits almost no anisotropy, obtained by means of this method of manufacture.

More specifically, the present invention aims to provide a transparent electrically conductive substrate in which the value of $R_{TD}/R_{MD}$ is in the range 0.8 to 1.2 and preferably 0.9 to 1.1.

Means for Solving the Problem

Figure 6:
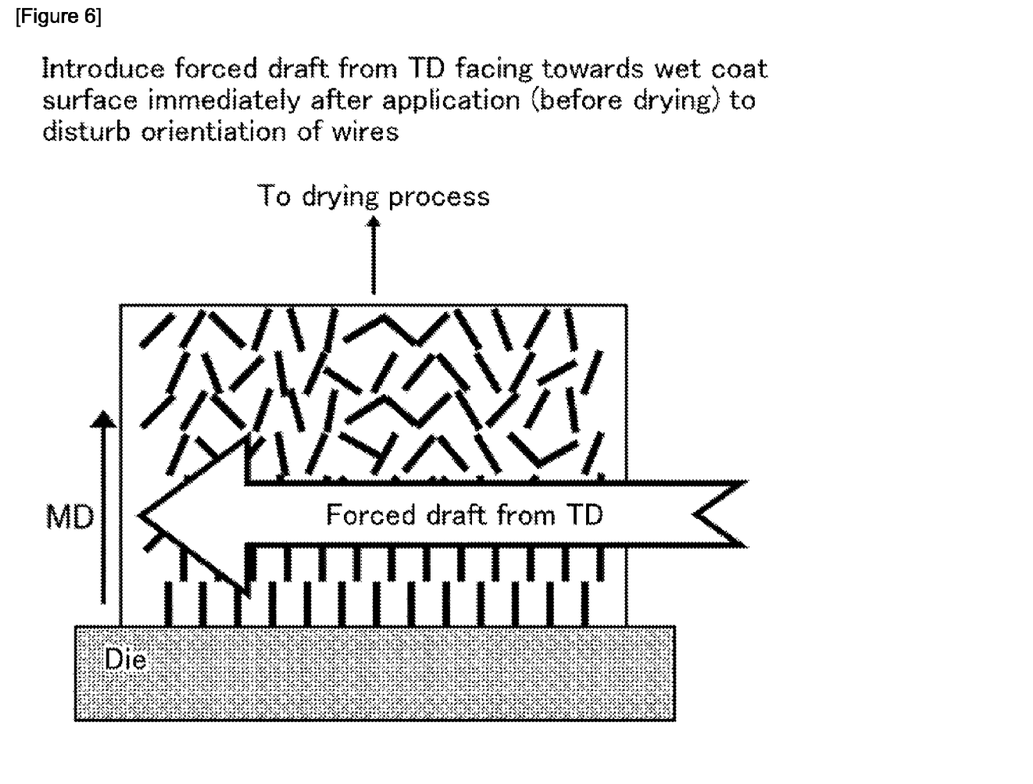
FIG. 6 is a diagram explaining a preliminary test of the present invention in which a forced draft was introduced from the substrate film TD in order to modify the orientation of the metallic nanowires after application of a coating liquid (nanowires+aqueous solvent).
Figure 7:
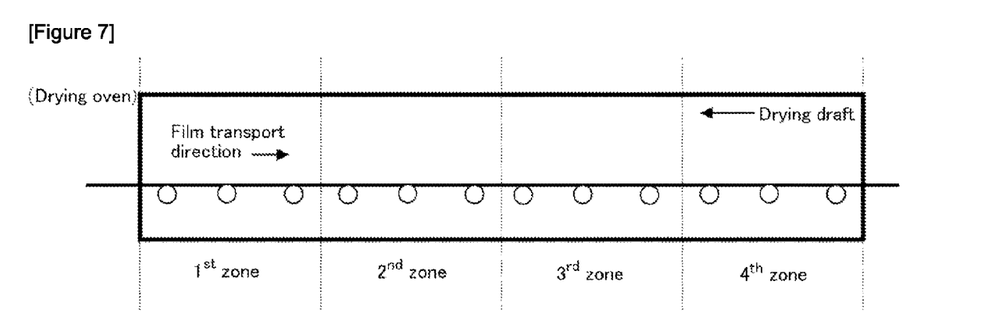
FIG. 7 is a diagram explaining the positional relationship between four divided zones in a drying oven used in the process in which the orientation of the metallic nanowires is modified.

In order to modify the orientation of the metallic nanowires the inventors of the present invention introduced a forced draft from the TD of the substrate film immediately after application of the coating liquid (nanowires+aqueous solvent). Tables 1 and 2 show the results of a preliminary test of the present invention shown in FIG. 6. It can be seen that $R_{TD}/R_{MD}$ is improved by the forced draft from the TD.

TABLE 1

| No forced draft from TD | | |
|---|---|---|
| $R_{TD}$ (Ω) | $R_{MD}$ (Ω) | $R_{TD}/R_{MD}$ |
| 67 | 47 | 1.43 |

TABLE 2

| With forced draft from TD | | |
|---|---|---|
| $R_{TD}$ (Ω) | $R_{MD}$ (Ω) | $R_{TD}/R_{MD}$ |
| 63 | 48 | 1.31 |

However, the improvement in anisotropy was not sufficient ($R_{TD}/R_{MD}$=1.31). It is thought that this was because the coating liquid on the substrate (the wet layer) was thick, at about 15 μm, so the quantity of nanowires protruding from the wet layer (sticking out above the surface of the wet layer) was small, and so even though a forced draft was introduced from the TD only a small quantity of nanowires were subjected to the draft and had their orientation altered (refer to FIG. 1). Further, another influencing factor is thought to be that since the coating liquid immediately after application contains a large amount of solvent and the nanowires have a high degree of freedom, even nanowires whose orientation has temporarily been disturbed by the forced draft from the TD may once again line up in the MD during the transport process. Accordingly, the inventors of the present invention introduced the forced draft in a drying process in which the thickness of the wet layer is reduced (refer to FIG. 2). In this way the anisotropy of the surface resistance was significantly improved, and the present invention was thus completed.

In other words, the essence of the present invention is the method of manufacturing a transparent electrically conductive substrate according to (1) to (6) below.

(1) A method of manufacturing a transparent electrically conductive substrate comprising:
  a process of applying a coating liquid containing metallic nanowires dispersed in a solvent onto a substrate to form a wet layer thereon,
  a process of drying the wet layer on the substrate to remove the solvent therefrom:
  wherein
  the process of drying includes introduction of a forced draft facing towards the wet layer from a direction that is different from the longitudinal direction of the substrate film on which the wet layer is formed, and the forced draft strikes the metallic nanowires protruding from the surface of the wet layer and alters an orientation of the metallic nanowires, such that the metallic nanowires become oriented non-uniformly.

(2) A method of manufacturing a transparent electrically conductive substrate comprising:
  an unwinding process whereby a substrate film wound in the form of a roll is unwound,
  an application process whereby a wet layer is formed by applying onto said substrate film a coating liquid that contains metallic nanowires dispersed in a solvent and that is squeezed out from a slot die,
  a transport process whereby the substrate film on which the wet layer has been formed is transported to a drying process,
  a drying process whereby solvent contained in the wet layer is removed by drying, and
  a rewinding process whereby the resulting transparent electrically conductive substrate is rewound,
  wherein:
  the drying process includes introduction of a forced draft facing towards the wet layer from a direction that is different from the longitudinal direction of the substrate film on which the wet layer is formed, and the forced draft strikes the metallic nanowires protruding from the surface of the wet layer and alters an orientation of the metallic nanowires, such that the metallic nanowires become oriented non-uniformly.

(3) The method of manufacturing a transparent electrically conductive substrate according to (1) or (2) above, wherein the forced draft is introduced facing towards the wet layer after the thickness of the wet layer has been reduced to 13 μm or less.

(4) The method of manufacturing a transparent electrically conductive substrate according to (1) or (2) above, wherein the forced draft is introduced facing towards the wet layer in a direction substantially perpendicular to the longitudinal direction of the substrate film after the thickness of said wet layer has been reduced to 13 μm or less.

(5) The method of manufacturing a transparent electrically conductive substrate according to (1) or (2) above, wherein the forced draft is introduced facing towards the wet layer at a wind speed of 4 to 20 m/s after the thickness of said wet layer has been reduced to 13 μm or less.

(6) The method of manufacturing a transparent electrically conductive substrate according to (1) or (2) above, wherein the forced draft regulated to a temperature of 30 to 60° C. is introduced facing towards the wet layer after the thickness of said wet layer has been reduced to 13 μm or less.

Further, the essence of the present invention is the transparent electrically conductive substrate according to (7) below.

(7) Transparent electrically conductive substrate being a transparent electrically conductive substrate manufactured by employing any of the methods in (1) to (7) above, characterised in that it is represented by formula 1 mentioned below, where $R_{MD}$ is defined as the surface resistance in the longitudinal direction of the substrate film and $R_{TD}$ is defined as the surface resistance in the direction perpendicular to the longitudinal direction of the substrate film.

$$R_{TD}/R_{MD} = 0.8 \text{ to } 1.2 \qquad (1)[\text{Formula 1}]$$

Advantages of the Invention

The present invention improves the anisotropy of the state of orientation of metallic nanowires in a transparent electrically conductive substrate comprising a substrate film on which is provided a conductive stratum containing metallic nanowires. The present invention is able to provide a method of manufacturing a transparent electrically conductive substrate whose surface resistance exhibits almost no anisotropy, and a transparent electrically conductive substrate whose surface resistance exhibits almost no anisotropy, obtained by means of this method of manufacture. Thus transparent electrically conductive substrates according to the present invention are suitable for use in touch panel electrodes and the like in which the surface resistance is preferably isotropic.

MODE OF EMBODYING THE INVENTION

{Metallic Nanowires}

In the present invention metallic nanowires function as the main conductor, comprising a transparent conductive material. The metallic element employed in the metallic nanowires can be an element whose conductivity in the bulk state is $1 \times 10^6$ S/m or more. Specific examples include Ag, Cu, Au, Al, Rh, Ir, Co, Zn, Ni, In, Fe, Pd, Pt, Sn, Ti and the like. Combinations of two or more types of metallic nanowire can also be used, but from the point of view of conductivity it is preferable to use elements selected from Ag, Cu, Au, Al and Co.

There is no particular limitation to the means of manufacture of the metallic nanowires, and conventional means such as liquid phase or gas phase methods can for example be used. For example, reference can be made to non-patent literature 1 and 2 for methods of manufacturing Ag nanowires, to patent literature 3 for a method of manufacturing Au nanowires, to patent literature 4 for a method of manufacturing Cu nanowires, and to patent literature 5 for a method of manufacturing Co nanowires. In particular, the methods of manufacturing Ag nanowires reported in the abovementioned non-patent literature 1 and 2 are water based and allow a large amount of Ag nanowires to be manufactured easily, and as Ag has the largest conductivity of all metals, these methods can be applied preferably as methods of manufacturing metallic nanowires relating to the present invention.

With the present invention a three-dimensional conductive network is formed by the metallic nanowires coming into contact with each other, and a high conductivity is achieved, while light can be transmitted through apertures in the conductive network where there are no metallic nanowires, and thus both high conductivity and high transmittance can coexist.

From considerations of transparency, the diameter of the metallic nanowires in the present invention is preferably 200 nm or less and more preferably 100 nm or less. The average length of metal nanowires is preferably 1 μm or more from considerations of conductivity, and 100 μm or less in consideration of the effect on transparency due to agglomeration. More preferably it is between 1 and 50 μm and most preferably between 3 and 50 μm.

{Solvent, Preferably Aqueous Solvent}

In the present invention "aqueous solvent" refers to a solvent comprising at least 50% by weight of water. Of course pure water that does not contain any other solvent may also be used, and taking into account the dispersion stability of the metallic nanowires during drying, it is preferable for the amount of other solvents to be small. There is no particular limitation to components other than water in the aqueous solvent provided that they are solvents that are miscible with water, but alcohol-based solvents can preferably be used, and of these isopropyl alcohol, whose boiling point is relatively close to that of water, is preferable.

{Substrate}

Any substrate can be used without any particular limitation provided that it is a transparent resin film. Preferable examples include polyester resin films such as polyethylene terephthalate (PET), polyethylene naphthalate, and modified polyester; polyolefin resin films such as polyethylene (PE) resin film, polypropylene (PP) resin film, polystyrene resin film, and cyclic olefin resin; vinyl resin films such as polyvinyl chloride and polyvinylidene chloride; polyetheretherketone (PEEK) resin film, polysulfone (PSF) resin film, polyether sulfone (PES) resin film, polycarbonate (PC) resin film, polyamide resin film, polyimide resin film, acrylic resin film, and triacetyl cellulose (TAC) resin film; but any resin film can be preferably employed as the transparent resin film in the present invention provided that it has a transmittance of at least 80% with respect to wavelengths in the visible range (380 to 780 nm). Of these, in terms of transparency, heat resistance, ease of handling, strength and cost, polyethylene terephthalate film and polycarbonate film are preferable.

{Preparation of Coating Liquid}

The coating liquid comprising metallic nanowires dispersed in a solvent, preferably an aqueous solvent, may contain additives and binders to adjust the viscosity, corrosion characteristics, adhesion force and the dispersion of nanowires. Examples of suitable additives and binders include, but are not limited to: carboxymethylcellulose (CMC), 2-hydroxyethyl cellulose (HEC), hydroxypropyl methylcellulose (HPMC), methylcellulose (MC), polyvinyl alcohol (PVA), tripropylene glycol (TPG), and xanthan gum (XG); surfactants such as ethoxylates, alkoxylates, ethylene oxide and propylene oxide and copolymers thereof; and sulfonates, sulfates, disulfonic acid, sulfosuccinates, phosphate esters, and fluorosurfactants (for example Zonyl (registered trademark), DuPont).

{Application Method}

Die coating methods and gravure coating methods may for example be employed, but since gravure coating methods leave engraved marks on the substrate, while die coating methods do not damage the substrate, die coating methods are most suitable.

{Manufacturing Method for Transparent Electrically Conductive Substrate}

Application process: The prepared coating liquid is applied onto the substrate using for example a die coater. There is no particular limit to the thickness of the coating liquid, but it is preferably about 10 to 30 μm.

Transport process: The substrate film on which a wet layer has been formed in the application process is transported to a drying process. There is no particular limit to the transportation means, but a roll conveyor is typical. If the transport process is long, the thickness of the wet layer may be reduced somewhat during said process. In such cases the forced draft used to modify the orientation of the nanowires may be introduced immediately in the drying process described hereinbelow. Further, if the transport process is short then it is preferable for a certain amount of drying to be performed to reduce the thickness of the wet layer before introducing the forced draft to modify the orientation of the nanowires.

Drying process: There is no particular limit to the drying method, and examples include heating methods using an infra-red heater or the like, or methods that heat by means of a drying draft, but if air stagnates within the drying oven then the concentration of solvent vapour will increase and drying will take longer so it is preferable to use a drying draft. In order to prevent the coating surface from becoming rough it is preferable for the drying draft to blow in the opposite direction to the direction of progress of the film. Further, it is preferable for the drying draft to flow at a distance of ten-odd to several tens of cm from the surface of the film. It should be noted that a drying draft is not essential in the drying process, and drying can be performed using only the draft in the process that is provided in the drying process to modify the orientation of the nanowires. In this case, the draft used to modify the orientation of the nanowires has a greater drying effect that the drying draft.

{Process for Modifying the Orientation of the Metallic Nanowires}

The process for modifying the orientation of the metallic nanowires is provided in the drying process.

Figure 4:
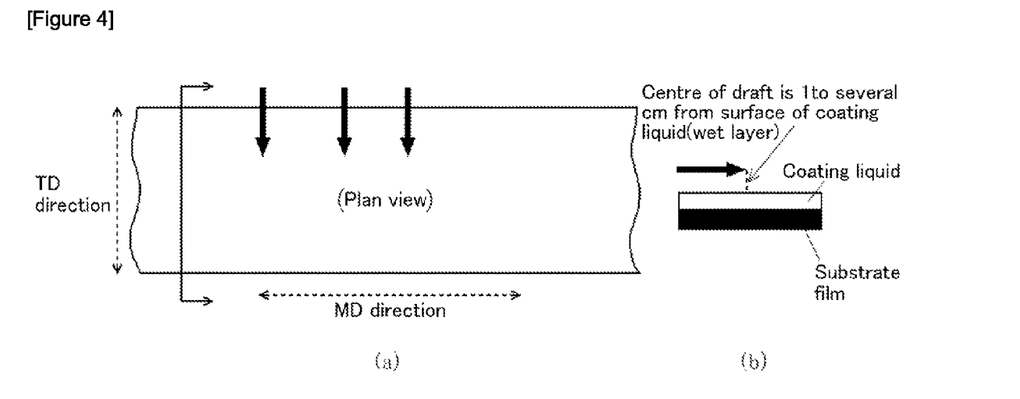
FIG. 4 is a diagram explaining the relationship between the film and the forced draft in a process in which the orientation of the metallic nanowires is modified, in an embodiment of the present invention. (a) is a diagram explaining that the forced draft is introduced in the TD, and (b) is a diagram explaining that the draft blows in a direction parallel to the substrate directly above the surface of the wet layer (the centre of the draft is 1 to several cm above the surface of the wet layer).

Specifically, the means involves introducing a draft facing towards the wet layer on the substrate from a direction different to the MD. The anisotropy can be improved most effectively if the direction of the draft is the TD. When the substrate film is viewed from above, it is most preferable for the draft to blow from one side to the other sides (in the TD) (refer to FIG. 4(a)). The centre of this draft preferably blows in a direction parallel to the substrate directly above (1 to several cm above) the surface of the wet layer (refer to FIG. 4(b)). If the draft blows such that it blows onto the wet layer then there is a danger that the smoothness of the substrate surface may be disturbed. The height of the draft is adjusted appropriately such that the draft strikes nanowires protruding from the substrate surface without disturbing the smoothness of the substrate surface.

The wind speed of the draft is preferably 4 to 20 m/s, and most preferably 8 to 12 m/s. If the wind speed is less than 4 m/s then the effect of changing the state of orientation of the nanowires is poor, and if it exceeds 20 m/s there is a danger that the smoothness of the substrate surface will be disturbed.

The temperature of the draft is preferably 30 to 60° C. If the temperature of the draft is higher then there is a danger that the appearance may be degraded, for example by the coating layer turning white. Further, if the temperature of the draft is higher the drying time is shortened, and the point at which the orientation of the nanowires can be modified becomes narrower. Conversely, if the temperature of the draft is lower, then the effect on the drying of the wet layer will be less and thus the point at which the orientation of the nanowires can be modified will become longer, but drying time will become longer so a temperature above ambient temperature, in particular 30° C. or higher, is preferable. It should be noted that if a drying draft is used in the drying process, then if the temperature of this draft (draft used to alter the orientation of the nanowires) and the temperature of the drying draft are the same then a single temperature control device is sufficient.

In order to reduce the forced draft time or increase the line speed it is in particular preferable to introduce the draft to alter the orientation of the nanowires after the thickness of the wet layer has been reduced to 13 μm or less by means of a drying draft or the like, and it is particularly preferable to introduce the draft after the thickness of the wet layer has been reduced to 10 μm or less. Further, introduction of the forced draft may be continued until the wet layer is completely dry, but it is also acceptable to stop the forced draft when the thickness of the wet layer has been reduced to an extent such that the nanowires have lost their freedom, even if some aqueous solvent still remains. Specifically, the forced draft may be stopped when the thickness of the wet layer is in the region of 5 μm or less. Drying may then be performed if necessary using a drying draft or the like.

{Surface Resistance of Transparent Electrically Conductive Substrate}

The surface resistance of transparent electrically conductive substrate of the present invention is represented by Formula 1 mentioned below, where $R_{MD}$ is defined as the surface resistance in the MD of the substrate film and $R_{TD}$ is defined as the surface resistance in the TD.

$$R_{TD}/R_{MD}=0.8 \text{ to } 1.2 \text{ (In particular 0.9 to 1.1 is preferable.)} \quad (1)[\text{Formula 1}]$$

The present invention will now be described more specifically with reference to embodiments, but the technical scope of the present invention is not limited by these examples. Further, in the embodiments % refers to % by weight in all cases unless specified otherwise.

[Embodiments]

{Embodiments 1-6}

<Coating Liquid>

Coating liquid: Mixture of 0.10 wt % metallic nanowires (fibre length: 1 to 100 μm) and 99.90 wt % solvent (pure water).

<Method of Manufacture>

Application process: Using die coating method, the coating liquid is squeezed out from a slot die onto the substrate film which is being transported by roll conveyor. The thickness of the wet layer immediately after application is 15.0 μm.

Transport process: The substrate film onto which the coating liquid has been squeezed out is transported by roll conveyor to a drying oven.

Drying process: Performed using a drying draft in a drying oven. Specifically, drying is performed by introducing drying air (40° C., 1 m/s) in the direction opposite to the direction of progress of the film, 30 cm above the surface of the wet layer. It should be noted that the drying draft was introduced in a zone in which a forced draft was not introduced from the TD. In other words, in the present embodiment a drying draft is not blown in zones in which a forced draft is introduced from the TD.

Figure 1:
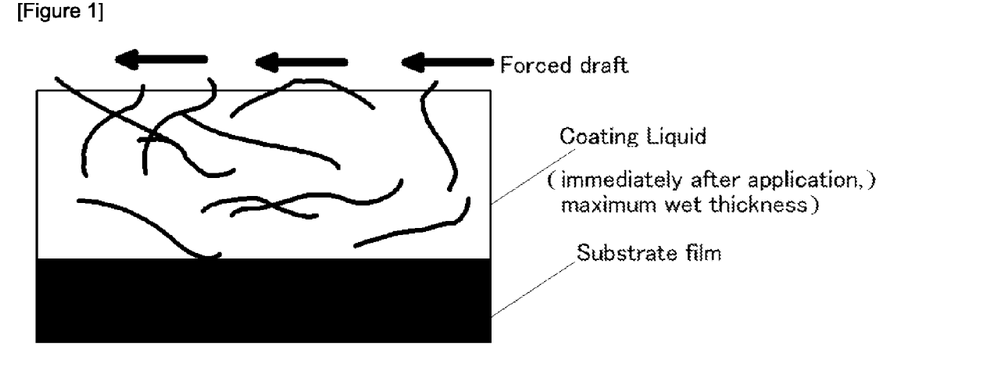
FIG. 1 is a diagram explaining the relationship between the metallic nanowires and the forced draft in a preliminary test shown in FIG. 6.
Figure 2:
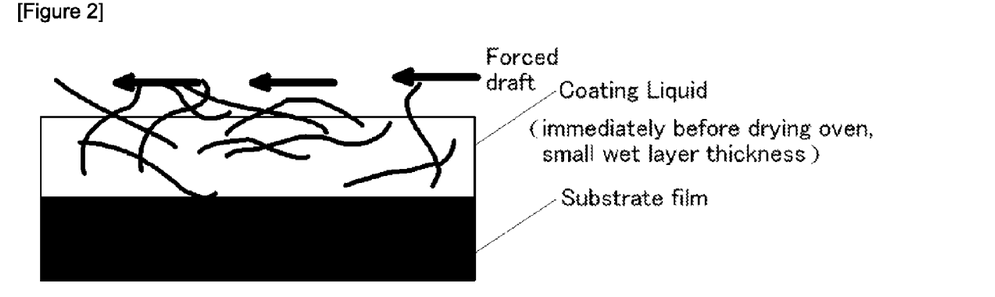
FIG. 2 is a diagram explaining the relationship between the metallic nanowires and the forced draft in an embodiment of the present invention.
Figure 3:
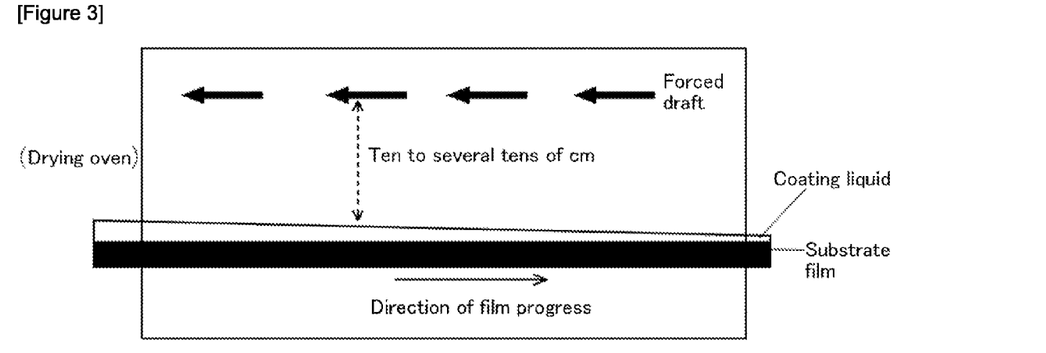
FIG. 3 is a diagram explaining the relationship between the film and the forced draft inside the drying oven in an embodiment of the present invention.

Process to modify the orientation of the metallic nanowires: As shown in the following figure, the drying process (drying oven) is divided into four zones, and as shown in FIG. 1 a draft (40° C., 10 m/s) is introduced from the TD direction. (Embodiments 1-6)

COMPARATIVE EXAMPLE 1

The same draft as in the embodiments was introduced from the TD before the substrate film was transported to the drying process, immediately after the coating liquid had been applied onto the substrate film from a slot die, and this is defined as Comparative example 1.

It should be noted that the film transport speed in Embodiments 1 to 6 and Comparative example 1 was 15 m/s.

<Measurement of Surface Resistance>

Two metal electrodes of length 30 mm and width 7 mm were prepared and were affixed such that the distance between the electrodes was 24 mm, the surfaces of the electrodes were connected to the clips of a tester (digital multimeter AD-5536 manufactured by A and D) using conducting wires, and this device was use to measure the resistances of the transparent electrically conductive substrates that had been obtained. The results are shown in Table 3.

of metallic nanowires was 0.18%, and solvent (pure water) was 99.82%, the film transport speed was 10 m/s, and the draft from the TD was blown in the first and second zones. The results are shown in Table 4.

TABLE 4

|  | Embodiment 7 | Embodiment 8 | Embodiment 9 |
|---|---|---|---|
| Wind speed (m/s) | 4.4 | 6.9 | 10.4 |
| Surface resistance ($R_{TD}$) ($\Omega$) | 53 | 51 | 51 |
| Surface resistance ($R_{MD}$) ($\Omega$) | 48 | 54 | 59 |
| $R_{TD}/R_{MD}$ | 1.10 | 0.94 | 0.86 |

Improvements in $R_{TD}/R_{MD}$ were observed by increasing the wind speed of the draft from the TD. Depending on the conditions, in some cases $R_{MD}$ even exceeded $R_{TD}$ ($R_{TD}/R_{MD}$ was less than 1).

A transparent electrically conductive substrate was manufactured under the same conditions as in embodiment 8, with only the film transport speed returned to 15 m/s. $R_{TD}/R_{MD}$ was 1.1. If the amount of reduction in the thickness of the wet layer is within the same range, then if a draft to modify the orientation of the nanowires is employed, the slower the film transport speed, the greater is the $R_{TD}/R_{MD}$ improvement effect.

TABLE 3

|  | Embod. 1 | Embod. 2 | Embod. 3 | Embod. 4 | Embod. 5 | Embod. 6 | Comp. example 1 |
|---|---|---|---|---|---|---|---|
| Location of forced draft from TD | 4th zone | 3rd zone | 3rd and 4th zones | 2nd zone | 1st zone | 1st and 2nd zones | Immediately after application |
| Variation in thickness of wet layer when forced draft introduced from TD (μm) | 6.8 to 0.1 | 7.4 to 6.8 | 7.4 to 0.1 | 10.5 to 7.4 | 13.1 to 10.5 | 13.1 to 7.4 | 15 |
| Surface resistance ($R_{TD}$) ($\Omega$) | 87 | 95 | 81 | 107 | 109 | 103 | 109 |
| Surface resistance ($R_{MD}$) ($\Omega$) | 83 | 90 | 81 | 90 | 92 | 95 | 84 |
| $R_{TD}/R_{MD}$ | 1.05 | 1.06 | 1.00 | 1.18 | 1.19 | 1.09 | 1.31 |

Improvements in $R_{TD}/R_{MD}$ were observed if a draft was blown from the TD when the thickness of the wet layer was 13 μm or less, but the improvement effects were observed particularly at 10 μm or less. It should be noted that in embodiments 5 and 6 a forced draft was immediately introduced from the TD during the drying process, and $R_{TD}/R_{MD}$ improvement effects were confirmed, but it is thought that this was because the thickness of the wet layer on the substrate film transported to the drying process had already been reduced to 13.1 μm.

{Embodiments 7-9}

Experiments were next performed varying the speed of the draft from the TD. It should be noted that the proportion

The invention claimed is:

1. A method of manufacturing a transparent electrically conductive substrate comprising:
    a step of applying a coating liquid containing metallic nanowires dispersed in a solvent onto a substrate to form a wet layer thereon,
    a step of drying the wet layer on the substrate to remove the solvent therefrom:
    wherein
    the step of drying includes introduction of a forced draft facing towards the wet layer from a direction that is different from the longitudinal direction of the substrate on which the wet layer is formed, and the forced draft strikes the metallic nanowires protruding from a surface of the wet layer and alters an orientation of the metallic nanowires, such that the metallic nanowires become oriented non-uniformly.

2. The method of manufacturing a transparent electrically conductive substrate according to claim 1,
wherein the forced draft is introduced facing towards the wet layer after the thickness of the wet layer has been reduced to 13 μm or less.

3. The method of manufacturing a transparent electrically conductive substrate according to claim 1,
wherein the forced draft is introduced facing towards the wet layer in a direction substantially perpendicular to the longitudinal direction of the substrate film after the thickness of said wet layer has been reduced to 13 μm or less.

4. The method of manufacturing a transparent electrically conductive substrate according to claim 1,
wherein the forced draft is introduced facing towards the wet layer at a wind speed of 4 to 20 m/s after the thickness of said wet layer has been reduced to 13 μm or less.

5. The method of manufacturing a transparent electrically conductive substrate according to claim 1,
wherein the forced draft, regulated to a temperature of 30 to 60° C., is introduced facing towards the wet layer after the thickness of said wet layer has been reduced to 13μm or less.

6. A method of manufacturing a transparent electrically conductive substrate comprising:
an unwinding step whereby a substrate film wound in the form of a roll is unwound,
an application step whereby a wet layer is formed by applying onto said substrate film a coating liquid that contains metallic nanowires dispersed in a solvent and that is squeezed out from a slot die,
a transport step whereby the substrate film on which the wet layer has been formed is transported to a drying step,
the drying step whereby solvent contained in the wet layer is removed by drying, and
a rewinding step whereby the resulting transparent electrically conductive substrate is rewound,
wherein:
the drying step includes introduction of a forced draft facing towards the wet layer from a direction that is different from the longitudinal direction of the substrate film on which the wet layer is formed, and the forced draft strikes the metallic nanowires protruding from a surface of the wet layer and alters an orientation of the metallic nanowires, such that the metallic nanowires become oriented non-uniformly.

7. The method of manufacturing a transparent electrically conductive substrate according to claim 6,
wherein the forced draft is introduced facing towards the wet layer after the thickness of the wet layer has been reduced to 13 μm or less.

8. The method of manufacturing a transparent electrically conductive substrate according to claim 6,
wherein the forced draft is introduced facing towards the wet layer in a direction substantially perpendicular to the longitudinal direction of the substrate film after the thickness of said wet layer has been reduced to 13 μm or less.

9. The method of manufacturing a transparent electrically conductive substrate according to claim 6,
wherein the forced draft is introduced facing towards the wet layer at a wind speed of 4 to 20 m/s after the thickness of said wet layer has been reduced to 13 μm or less.

10. The method of manufacturing a transparent electrically conductive substrate according to claim 6,
wherein the forced draft, regulated to a temperature of 30 to 60° C., is introduced facing towards the wet layer after the thickness of said wet layer has been reduced to 13 μm or less.

\* \* \* \* \*